US012603628B2

(12) United States Patent
Cheng

(10) Patent No.: US 12,603,628 B2
(45) Date of Patent: Apr. 14, 2026

(54) SEMICONDUCTOR STRUCTURE AND METHOD FOR PREPARING SEMICONDUCTOR STRUCTURE, FILM BULK ACOUSTIC RESONATOR AND METHOD FOR PREPARING FILM BULK ACOUSTIC RESONATOR

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 380 days.

(21) Appl. No.: 18/313,842

(22) Filed: May 8, 2023

(65) Prior Publication Data

US 2024/0223148 A1 Jul. 4, 2024

(30) Foreign Application Priority Data

Jan. 4, 2023 (CN) .......................... 202310009188.5

(51) Int. Cl.
*H03H 3/02* (2006.01)
*H03H 9/17* (2006.01)

(52) U.S. Cl.
CPC .............. *H03H 3/02* (2013.01); *H03H 9/171* (2013.01); *H03H 2003/023* (2013.01)

(58) Field of Classification Search
CPC .......... H03H 3/02; H03H 9/171; H03H 9/545;

H03H 9/02015; H03H 9/02133; H03H 9/173; H03H 2003/021; H03H 2003/023; H01L 21/02381; H01L 21/0262; H01L 21/02658; H01L 21/02664; C23C 14/48; C30B 25/186; C30B 29/403; H10P 14/24; H10P 14/2905; H10P 14/3416; H10P 14/36; H10P 14/38

See application file for complete search history.

(56) References Cited

U.S. PATENT DOCUMENTS

| | | | |
|---|---|---|---|
| 2008/0076211 A1* | 3/2008 | Casset | H03H 9/2405 |
| | | | 257/E21.502 |
| 2018/0182620 A1* | 6/2018 | Odnoblyudov | H01L 21/02389 |
| 2022/0102563 A1* | 3/2022 | Wang | G02B 6/136 |
| 2022/0149098 A1* | 5/2022 | Wang | H10F 39/8063 |

* cited by examiner

*Primary Examiner* — Steven B Gauthier
*Assistant Examiner* — Marc-Anthony Armand
(74) *Attorney, Agent, or Firm* — Westbridge IP LLC

(57) ABSTRACT

Disclosed are a semiconductor structure and a method for preparing a semiconductor structure, a film bulk acoustic resonator and a method for preparing a film bulk acoustic resonator. The method for preparing a semiconductor structure according to the present application includes: growing a first nitride layer on a surface, including an active silicon layer, of a substrate, and selectively removing a partial area of the active silicon layer to form a hollow structure, so that the first nitride layer and the substrate are partially separated, and then a stress between the substrate and the first nitride layer is released. A crack of the semiconductor structure is reduced and quality of the semiconductor structure is improved while a thickness of the semiconductor structure is guaranteed.

12 Claims, 4 Drawing Sheets

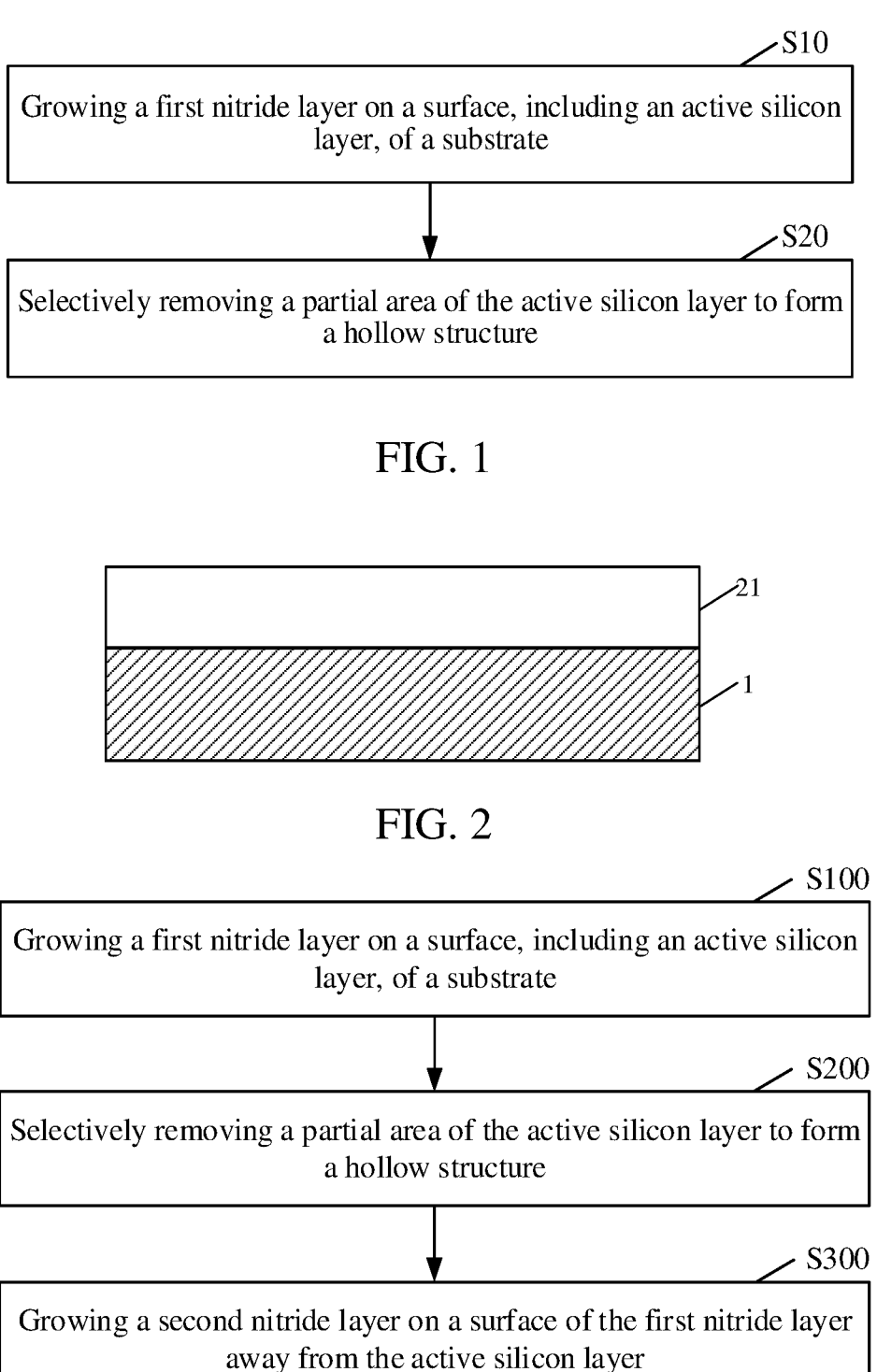

S10

Growing a first nitride layer on a surface, including an active silicon layer, of a substrate

S20

Selectively removing a partial area of the active silicon layer to form a hollow structure

Growing a first nitride layer on a surface, including an active silicon layer, of a substrate

S200

Selectively removing a partial area of the active silicon layer to form a hollow structure

S300

Growing a second nitride layer on a surface of the first nitride layer away from the active silicon layer

Providing a semiconductor structure

1020

Depositing a first electrode on the first nitride layer

1030

Providing a substrate with a cavity

1040

Bonding a surface of the first nitride layer close to the first electrode to a surface of the substrate with the cavity, where the first electrode is disposed in the cavity

1050

Completely removing the active silicon layer by using the active silicon layer as a sacrificial layer, so that the first nitride layer is completely separated from the substrate

1060

Preparing a second electrode on a surface of the first nitride layer away from the first electrode

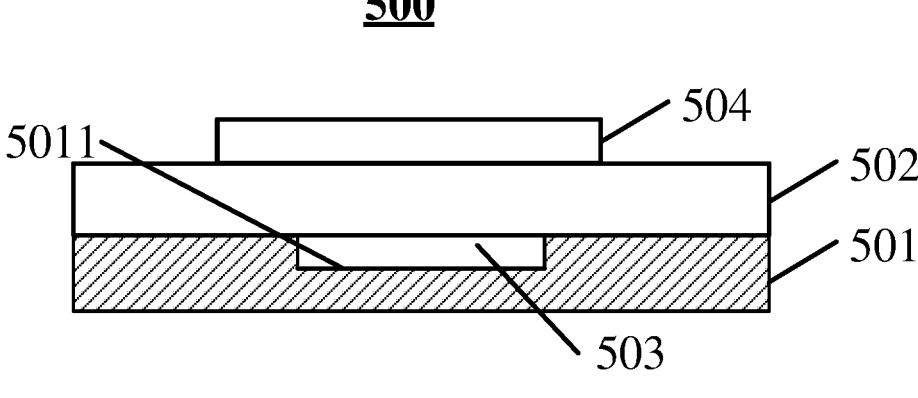

FIG. 7

SEMICONDUCTOR STRUCTURE AND METHOD FOR PREPARING SEMICONDUCTOR STRUCTURE, FILM BULK ACOUSTIC RESONATOR AND METHOD FOR PREPARING FILM BULK ACOUSTIC RESONATOR

CROSS-REFERENCE TO RELATED APPLICATIONS

This application claims priority to Chinese Patent Application No. 202310009188.5, filed on Jan. 4, 2023, which is hereby incorporated by reference in its entirety.

TECHNICAL FIELD

The present application relates to the field of semiconductor technologies, in particular to a semiconductor structure and a method for preparing a semiconductor structure, a film bulk acoustic resonator and a method for preparing a film bulk acoustic resonator.

BACKGROUND

As for a semiconductor structure prepared based on heterogeneous epitaxy technologies such as Metal-Organic Chemical Vapor Deposition (MOCVD), due to a large lattice mismatch and a thermal mismatch between materials of a heterogeneous substrate (such as sapphire, silicon, etc.) used in the heterogeneous epitaxy technologies and materials of the semiconductor structures, a stress between the semiconductor structure and the heterogeneous substrate will be generated, so that a crack may occur when the semiconductor structure is prepared to a certain thickness, which seriously affects quality of the semiconductor structure.

SUMMARY

An embodiment of the present application provides a semiconductor structure and a method for preparing a semiconductor structure, a film bulk acoustic resonator and a method for preparing a film bulk acoustic resonator.

According to a first aspect, an embodiment of the present application provides a method for preparing a semiconductor structure. The method includes: growing a first nitride layer on a surface, including an active silicon layer, of a substrate; and selectively removing a partial area of the active silicon layer to form a hollow structure.

As an optional embodiment, before the growing a first nitride layer on a surface, including an active silicon layer, of a substrate, the method further includes: performing an ion implantation on the active silicon layer to form a heavily doped region and a lightly doped region alternated with each other.

As an optional embodiment, a dopant ion used in a step of the performing an ion implanting on the active silicon layer is a N-type dopant ion or a P-type dopant ion.

As an optional embodiment, an area of the heavily doped region is larger than an area of the lightly doped region.

As an optional embodiment, the partial area includes a heavily doped region, and the selectively removing a partial area of the active silicon layer to form a hollow structure includes: selectively removing the heavily doped region of the active silicon layer by an electrochemical etching to form the hollow structure.

As an optional embodiment, a hole ratio of the hollow structure is controlled by controlling a bias voltage of the electrochemical etching.

As an optional embodiment, after the selectively removing a partial area of the active silicon layer to form a hollow structure, the method further includes: growing a second nitride layer on a surface of the first nitride layer away from the active silicon layer, where a material of the second nitride layer is the same as a material of the first nitride layer.

As an optional embodiment, the first nitride layer and the second nitride layer form a nitride layer, the nitride layer is made of aluminum nitride, and a thickness of the nitride layer is less than 300 nm.

As an optional embodiment, the substrate is a silicon-on-insulator substrate, and the silicon-on-insulator substrate includes a support layer, a bonding layer, and the active silicon layer arranged in layers.

As an optional embodiment, a crystal plane of the active silicon layer is Si (111).

As an optional embodiment, the substrate is a QST engineered substrate, and the QST engineered substrate includes a polycrystalline ceramic core, a barrier layer, a bonding layer, and the active silicon layer arranged in layers. The active silicon layer is used as a sacrificial layer.

As an optional embodiment, a material of the active silicon layer is single crystal silicon.

As an optional embodiment, a shape of a horizontal cross-section of the hollow structure is at least one of triangle, circle, ellipse, polygon, strip and mesh. The horizontal cross-section of the hollow structure is parallel to the substrate.

According to a second aspect, an embodiment of the present application provides a semiconductor structure, including: a substrate including an active silicon layer, where the active silicon layer has a hollow structure; and a first nitride layer disposed on a surface of the active silicon layer.

As an optional embodiment, the semiconductor structure further includes: a device structure disposed on a surface of the first nitride layer away from the active silicon layer, where the device structure is at least one of a light-emitting diode, a high electron mobility transistor, a high mobility diode, a Metal-Oxide-Semiconductor Field Effect Transistor (MOSFET), a Ultraviolet Light Emitting Diode (UV-LED), a photodetector, a hydrogen generator and a solar cell.

According to a third aspect, an embodiment of the present application provides a method for preparing a film bulk acoustic resonator, including: providing a semiconductor structure, where the semiconductor structure includes a substrate and a first nitride layer, the substrate includes an active silicon layer with a hollow structure, and the first nitride layer is disposed on a surface of the active silicon layer; depositing a first electrode on the first nitride layer; providing a substrate with a cavity; bonding a surface of the first nitride layer close to the first electrode to a surface of the substrate with the cavity, the first electrode being disposed in the cavity; completely removing the active silicon layer by using the active silicon layer as a sacrificial layer, so that the first nitride layer is completely separated from the substrate; and preparing a second electrode on a surface of the first nitride layer away from the first electrode.

As an optional embodiment, the completely removing the active silicon layer by using the active silicon layer as a sacrificial layer includes: removing the substrate through at least one of a mechanical polishing, a dry etching, a wet etching and a chemical etching by using the active silicon layer as the sacrificial layer.

According to a fourth aspect, an embodiment of the present application provides a film bulk acoustic resonator. The film bulk acoustic resonator is prepared by the method for preparing a film bulk acoustic resonator according to the third aspect. The film bulk acoustic resonator includes: a substrate with a cavity, a first electrode, a first nitride layer and a second electrode. The first electrode is disposed in the cavity.

As an optional embodiment, the first electrode and the second electrode are both interdigital electrodes.

The method for preparing a semiconductor structure according to an embodiment of the present application, by growing a first nitride layer on a surface, including an active silicon layer, of a substrate, and selectively removing a partial area of the active silicon layer to form a hollow structure, so that the first nitride layer and the substrate are partially separated, and then a stress between the substrate and the first nitride layer is released. A crack of the semiconductor structure is reduced and quality of the semiconductor structure is improved while a thickness of the semiconductor structure is guaranteed.

Furthermore, after the selectively removing a partial area of the active silicon layer to form a hollow structure, a second nitride layer is grown on a surface of the first nitride layer away from the active silicon layer. Since a material of the second nitride layer is the same as a material of the first nitride layer, a stress and a crack may not occur, and a preparation thickness of the semiconductor structure is further increased.

BRIEF DESCRIPTION OF THE DRAWINGS

The above and other objects, features and advantages of the present application will become more apparent through a more detailed description of the embodiments of the present application in combination with the accompanying drawings. The accompanying drawings are used to provide a further understanding of the embodiments of the present application, and constitute a part of the specification, and are used together with the embodiments of the present application to explain the present application, and do not constitute limitations to the present application. In the accompanying drawings, the same reference numerals generally represent the same components or steps.

FIG. 1 is a schematic flowchart of a method for preparing a semiconductor structure according to an exemplary embodiment of the present application.

FIG. 2 is a schematic structural diagram of a substrate and a first nitride layer according to an exemplary embodiment of the present application.

FIG. 3 is a schematic flowchart of a method for preparing a semiconductor structure according to another exemplary embodiment of the present application.

FIG. 6 is a schematic flowchart of a method for preparing a film bulk acoustic resonator according to an exemplary embodiment of the present application.

FIG. 7 is a schematic structural diagram of a film bulk acoustic resonator according to an exemplary embodiment of the present application.

DETAILED DESCRIPTION OF THE EMBODIMENTS

Figure 4A:
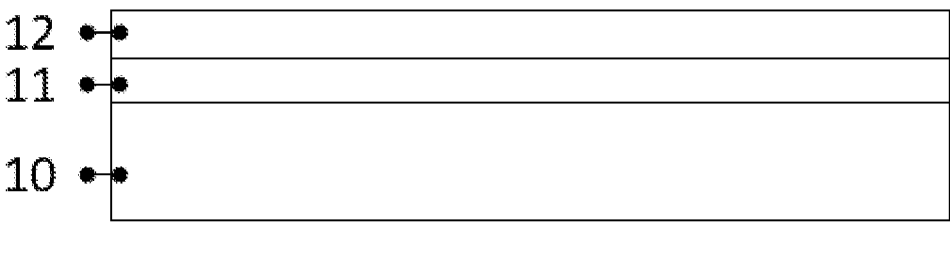
FIG. 4A-FIG. 4E are schematic structural diagrams of a semiconductor structure prepared on a silicon-on-insulator substrate according to an exemplary embodiment of the present application.

The technical schemes in the embodiments of the present disclosure will be described clearly and completely below in combination with the accompanying drawings in the embodiments of the present disclosure. Obviously, the described embodiments are only a part of the embodiments of the present disclosure, not all of the embodiments. Based on the embodiments in the present disclosure, all other embodiments obtained by those skilled in the art without creative efforts shall fall within the protection scope of the present disclosure.

With the development of thin-film and micro-nano manufacturing technologies, electronic devices are developing rapidly toward a direction of miniaturization, high-density multiplexing, high frequency and low power consumption. The film bulk acoustic resonator developed in recent years adopts an advanced resonance technology, which converts electrical energy into acoustic waves through an inverse piezoelectric effect of a piezoelectric film to form resonance. The resonance technology may be used to prepare advanced components, like thin film frequency shaping devices. The film bulk acoustic resonator acoustic wave device has characteristics of small size, low cost, high quality factor, strong power withstand capability, high frequency (up to 1-10 GHZ) and compatible with IC technology, suitable for working in 1-10 GHZ radio frequency (RF) system application, so the film bulk acoustic resonator acoustic wave device has broad application prospects in the field of new generation wireless communication systems and ultra-trace biochemical detection.

A core structure of the film bulk acoustic resonator includes a semiconductor structure. A material of the semiconductor structure is generally aluminum nitride (AlN). A traditional preparation method is to form a high C-axis oriented aluminum nitride film by low-temperature sputtering. A rocking curve width (Full Width at Half Maxima, FWHM) of the X-ray diffraction (XRD) of the aluminum nitride film obtained by the method in a 002 direction is 2-3°, and crystal quality is not high, which limits the device to obtain a larger bandwidth and less loss.

Single crystal aluminum nitride thin films are generally prepared based on heteroepitaxy technologies, such as a metal-organic chemical vapor deposition technology. Due to a large lattice mismatch and a thermal mismatch between materials of a heterogeneous substrate (such as sapphire, silicon, etc.) used in the heterogeneous epitaxy technologies and materials of the single crystal aluminum nitride film, a stress between the single crystal aluminum nitride film and the heterogeneous substrate will be generated, so that a crack will occur when the single crystal aluminum nitride film is prepared to a certain thickness, which seriously affects quality of the single crystal aluminum nitride film and makes it difficult to obtain a required thickness.

In order to solve the above technical problems, the present application selectively removes a partial area of an active silicon layer to form a hollow structure, so that the first nitride layer and the substrate are partially separated, and then a stress between the substrate and the first nitride layer is released. A crack of the semiconductor structure is reduced and quality of the semiconductor structure is improved while a thickness of the semiconductor structure is guaranteed.

According to an embodiment of the present application, after the selectively removing a partial area of the active silicon layer to form a hollow structure, a second nitride layer is grown on a surface of the first nitride layer away from the active silicon layer, that is, the first nitride layer and the second nitride layer are prepared in two steps. Since a material of the second nitride layer is the same as a material of the first nitride layer, a stress and a crack may not occur, and a preparation thickness of the semiconductor structure is further increased.

A method for preparing a semiconductor structure is described in detail below.

FIG. 1 is a schematic flowchart of a method for preparing a semiconductor structure according to an exemplary embodiment of the present application. As shown in FIG. 1, a method for preparing a semiconductor structure according to an embodiment of the present application includes the following steps.

Step S10, growing a first nitride layer on a surface, including an active silicon layer, of a substrate.

Specifically, a material of the first nitride layer and a material of the active silicon layer are different. The first nitride layer may be a nitride layer with a preset thickness.

FIG. 2 is a schematic structural diagram of a substrate and a first nitride layer according to an exemplary embodiment of the present application. In an embodiment of the present application, as shown in FIG. 2, the substrate 1 and the first nitride layer 21 are arranged in layers. Before preparing the first nitride layer 21, the surface of the substrate 1 (such as sapphire, silicon, etc.) is treated with hydrochloric acid, so that the surface may form the active silicon layer. Due to a large lattice mismatch and a thermal mismatch between materials of the substrate 1 (such as sapphire, silicon, surface active silicon, etc.) and materials of the first nitride layer 21, a stress between the first nitride layer 21 and the substrate 1 will be generated, so that a crack will occur when the first nitride layer 21 is prepared to a preset thickness (such as 300 nanometers), which makes it impossible to continue preparing a thicker nitride layer, and seriously affects quality of the semiconductor structure.

Step S20, selectively removing a partial area of the active silicon layer to form a hollow structure.

Specifically, the partial area of the active silicon layer may be selectively removed by a laser irradiation lift-off technology or a light-assisted electrochemical etching to form a hollow structure, thereby partially separating the first nitride layer and the substrate. The substrate 1 includes the active silicon layer, that is, partial separation of the first nitride layer 21 and the substrate 1 may be achieved by selectively removing the partial area of the active silicon layer to form a hollow structure.

In an embodiment of the present application, after the first nitride layer is grown on the substrate, the first nitride layer 21 is partially separated from the substrate 1, the stress between the substrate and the first nitride layer is further released while ensuring a supporting effect of the substrate on the first nitride layer, which is conducive to improve quality of the first nitride layer.

In an embodiment of the present application, before the first nitride layer 21 is grown on a surface, including an active silicon layer, of a substrate 1, an ion implantation is performed on the active silicon layer to form a heavily doped region and a lightly doped region alternated with each other. After the first nitride layer is formed, the heavily doped region of the active silicon layer is selectively removed by an electrochemical etching, thereby forming a hollow structure in the active silicon layer. A dopant ion in the ion implantation step is a N-type dopant ion or a P-type dopant ion. A hole ratio of the hollow structure is controlled by controlling a bias voltage of the electrochemical etching. An area of the heavily doped region is larger than an area of the lightly doped region.

FIG. 3 is a schematic flowchart of a method for preparing a semiconductor structure according to another exemplary embodiment of the present application. As shown in FIG. 3, the method for preparing a semiconductor structure according to an embodiment of the present application includes the following steps.

Step S100, growing a first nitride layer on a surface, including an active silicon layer, of a substrate.

Step S200, selectively removing a partial area of the active silicon layer to form a hollow structure.

Step S300, growing a second nitride layer on a surface of the first nitride layer away from the active silicon layer.

A material of the second nitride layer is the same as a material of the first nitride layer.

The second nitride layer is grown on the surface of the first nitride layer far away from the active silicon layer. Since the partial area of the active silicon layer is selectively removed to form the hollow structure, the first nitride layer and the substrate are partially separated, and a stress between the substrate and the first nitride layer is released. The material of the second nitride layer is the same as a material of the first nitride layer, there is no lattice mismatch and thermal mismatch, so there will be no stress between the second nitride layer and the first nitride layer, so the second nitride layer of the secondary growth will not occur cracks, which improves a thickness and quality of the semiconductor structure.

In an actual application process, the first nitride layer and the second nitride layer are prepared in two steps; first, a first nitride layer with a preset thickness is grown on a surface, including an active silicon layer, of a substrate, and then the first nitride layer and the substrate are partially separated, and then a second nitride layer is grown on a surface of the first nitride layer away from the substrate to obtain a semiconductor structure.

Specifically, a material of the second nitride layer is the same as a material of the first nitride layer.

Furthermore, the first nitride layer and the second nitride layer form a nitride layer, the nitride layer is made of aluminum nitride, and a thickness of the nitride layer is less than 300 nm.

Figure 4B:
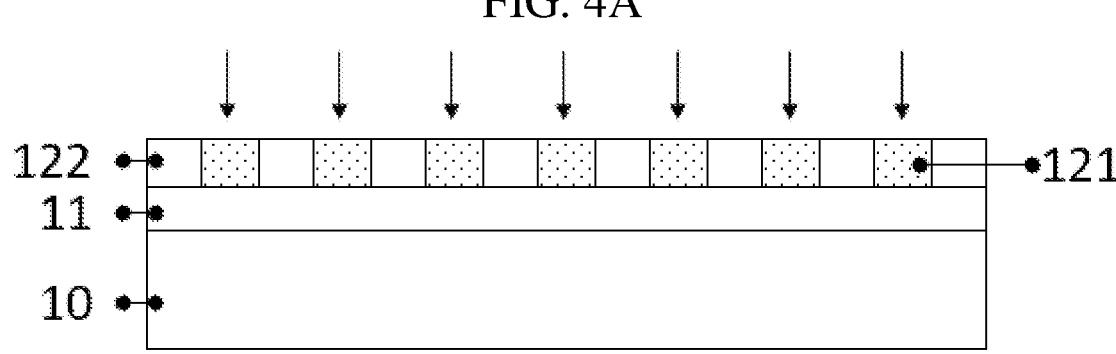
Figure 4C:
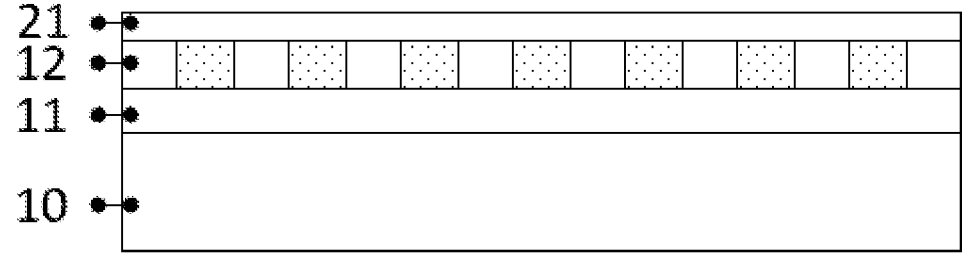
Figure 4D:
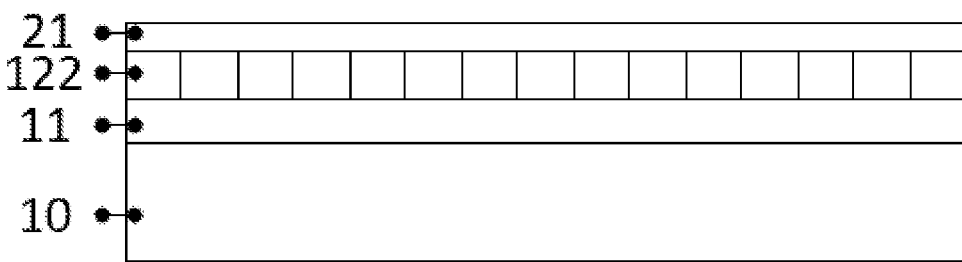
Figure 4E:
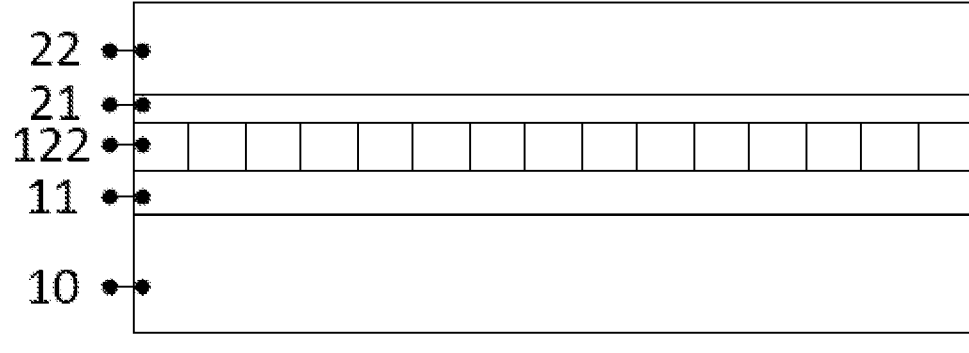

FIG. 4A-FIG. 4E are schematic structural diagrams of a semiconductor structure prepared on a silicon-on-insulator substrate according to an exemplary embodiment of the present application. As shown in FIG. 4A, the substrate 1 is a silicon-on-insulator substrate, and the silicon-on-insulator substrate 1 includes a support layer 10, a bonding layer 11 and an active silicon layer 12 from bottom to top. Optionally, a crystal plane of the active silicon layer is Si (111). As shown in FIG. 4B, an ion implantation is performed on the active silicon layer 12 to form a heavily doped region 121 and a lightly doped region 122 alternated with each other. Optionally, a doping ion used in a step of the performing an ion implantation on the active silicon layer is a N-type dopant ion or a P-type dopant ion. As shown in FIG. 4C, a first nitride layer 21 with a preset thickness is grown on a surface of the active silicon layer 12 of the substrate 1. As shown in FIG. 4D, the heavily doped region 121 of the active silicon layer is removed by an electrochemical etching to form a hollow structure in the active silicon layer, thereby partially separating the first nitride layer 21 and the active silicon layer 12 of the substrate 1. Optionally, a hole ratio of the hollow structure is controlled by controlling a bias voltage of the electrochemical etching. In an embodiment, an area of the heavily doped region 121 is greater than an area of the lightly doped region 122, that is, the hole ratio is greater than 50%. As shown in FIG. 4E, after the selectively removing a partial area of the active silicon layer 12 to form a hollow structure, the method for preparing a semiconductor structure also includes: growing a second nitride layer 22 on a surface of the first nitride layer 21 away from the active silicon layer 12. A material of the second nitride layer 22 is the same as a material of the first nitride layer 21. The first nitride layer 21 and the second nitride layer 22 form a nitride layer. The nitride layer is made of aluminum nitride. A thickness of the nitride layer is less than 300 nm.

Figure 5:
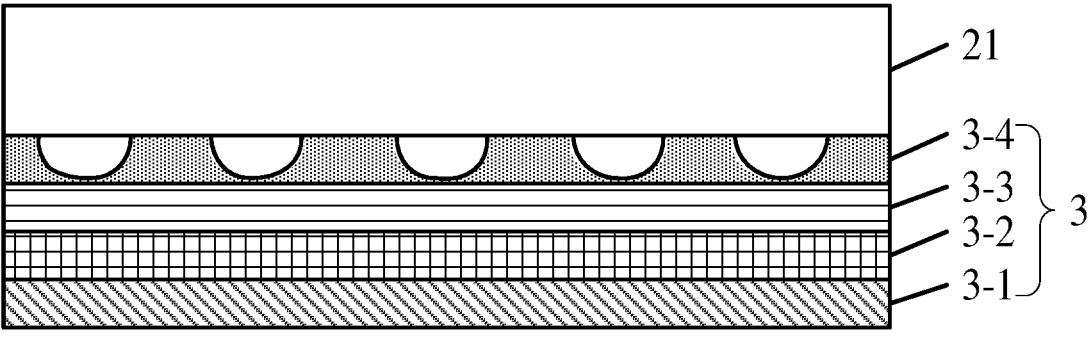
FIG. 5 is a schematic structural diagram of an engineered substrate and a first nitride layer according to an exemplary embodiment of the present application.

FIG. 5 is a schematic structural diagram of a QST engineered substrate 3 and a first nitride layer 21 according to an exemplary embodiment of the present application. The substrate is a QST engineered substrate 3, and the engineered substrate 3 is stacked with a polycrystalline ceramic core 3-1, a barrier layer 3-2, a bonding layer 3-3 and an active silicon layer 3-4 from bottom to top. The active silicon layer 3-4 (that is, a single crystal silicon layer) is used as a sacrificial layer, the first nitride layer 21 and the substrate 4 are partially separated by partially removing the active silicon layer 3-4.

As shown in FIG. 5, in the embodiment, by selectively removing the active silicon layer 3-4 at the interface between the active silicon layer 3-4 and the first nitride layer 21, the first nitride layer 21 and the engineered substrate 3 are partially separated. It is understood that FIG. 5 is only an example, and those skilled in the art may choose a method of partially removing the active silicon layer 3-4 according to an actual situation, which is not further limited in this embodiment of the present application.

Optionally, a shape of a horizontal cross-section of the hollow structure of the substrate is at least one of triangle, circle, ellipse, polygon, strip and mesh. The horizontal cross-section of the hollow structure is parallel to the substrate.

In the embodiment, a thermal expansion coefficient of the polycrystalline ceramic core of the engineered substrate matches that of the semiconductor structure. A material of the semiconductor structure includes aluminum nitride. Specifically, using the polycrystalline ceramic core whose thermal expansion coefficient matches that of the semiconductor structure helps prevent cracks in the semiconductor structure, thereby improving quality of the semiconductor structure.

An embodiment of the present application provides a semiconductor structure. As shown in FIG. 5, the semiconductor structure includes a substrate 3, which is a composite substrate, including an active silicon layer disposed on the top layer of the substrate 3, and the active silicon layer 3-4 has a hollow structure. The semiconductor structure also includes the first nitride layer 21 above the substrate 3. The first nitride layer 21 is disposed on the substrate 3, and the first nitride layer 21 and the substrate 3 are partially separated. In an embodiment of the present application, the semiconductor structure further includes a device structure above the first nitride layer 21 (not shown in FIG. 5). The device structure is at least one of a light-emitting diode, a high electron mobility transistor, a high mobility diode, a MOSFET, a UV-LED, a photodetector, a hydrogen generator and a solar cell.

FIG. 6 is a flowchart of a method for preparing a film bulk acoustic resonator according to an embodiment of the present application. As shown in FIG. 6, a method for preparing a film bulk acoustic resonator according to an embodiment of the present application includes the following steps.

Step 1010, providing a semiconductor structure.

The semiconductor structure includes a substrate and a first nitride layer, the substrate includes an active silicon layer with a hollow structure, and the first nitride layer is disposed on a surface of the active silicon layer.

Exemplarily, the semiconductor structure is prepared based on the method for preparing a semiconductor structure mentioned in any of the above embodiments. Specifically, the semiconductor structure includes a substrate, a first nitride layer and a second oxide layer arranged in layers.

Step 1020, depositing a first electrode on the first nitride layer.

Exemplarily, if the semiconductor structure includes a substrate, a first nitride layer and a second oxide layer arranged in layers, the first electrode is deposited on the second oxide layer.

Step 1030, providing a substrate with a cavity.

Step 1040, bonding a surface of the first nitride layer close to the first electrode to a surface of the substrate with the cavity, where the first electrode is disposed in the cavity.

Step 1050, completely removing the active silicon layer by using the active silicon layer as a sacrificial layer, so that the first nitride layer is completely separated from the substrate.

Exemplarily, the engineered substrate may be removed by a stripping process of a mechanical polishing, a dry etching, a wet etching or a chemical etching.

Exemplarily, an etching chemical is hydrofluoric acid or sulfuric acid.

Step 1060, preparing a second electrode on a surface of the first nitride layer away from the first electrode.

In an actual application process, a substrate with a cavity is firstly provided, then a surface of a semiconductor structure close to a first electrode is bonded to a surface of the substrate with the cavity, where the first electrode is disposed in the cavity of the substrate, the substrate on another surface of the semiconductor structure is completely removed, and the second electrode is prepared on the surface of the semiconductor structure away from the first electrode.

A method for preparing a film bulk acoustic resonator according to an embodiment of the present application adopts the semiconductor structure prepared by the above mentioned method for preparing a semiconductor structure. The semiconductor structure has higher quality, thereby improving resonant characteristics of the film bulk acoustic resonator prepared and more precisely controlling frequency of an electronic equipment.

An embodiment of the present application also provides a film bulk acoustic resonator, which is prepared based on the method for preparing the film bulk acoustic resonator mentioned in the above embodiment. FIG. 7 is a schematic structural diagram of a film bulk acoustic resonator according to an exemplary embodiment of the present application. As shown in FIG. 7, the film bulk acoustic resonator 500 includes a substrate 501 with a cavity 5011, a nitride layer 502, a first electrode 503 and a second electrode 504. The first electrode 503 is disposed in the cavity 5011. The nitride layer 502 includes the first nitride layer and the second nitride layer in the above embodiments.

In an embodiment of the present application, the first electrode and the second electrode are both interdigital electrodes.

Exemplarily, the film bulk acoustic resonator refers to an electronic component that generates a resonant frequency, and has functions such as frequency control, image elimination, spurious filtering, and channel selection.

The basic principles of the present application have been described above in combination with specific embodiments, but it should be pointed out that the advantages, benefits, effects mentioned in the present application are only examples rather than limitations, and these advantages, benefits, effects, etc. cannot be considered necessary for each embodiment of the present application. In addition, the specific details disclosed above are only for a purpose of illustration and understanding, rather than limitation, and the above details do not limit the present application to be implemented by using the above specific details.

The above description has been presented for purposes of illustration and description. Furthermore, this description is not intended to limit the embodiments of the present application to the forms disclosed herein. Although a number of example aspects and embodiments have been discussed above, those skilled in the art will recognize certain variations, modifications, changes, additions and sub-combinations thereof.

What is claimed is:

1. A method for preparing a semiconductor structure, comprising:

growing a first nitride layer on a surface, comprising an active silicon layer, of a substrate;

selectively removing a partial area of the active silicon layer to form a hollow structure; and growing a second nitride layer on a surface of the first nitride layer away from the active silicon layer, wherein a material of the second nitride layer is the same as a material of the first nitride layer.

2. The method for preparing a semiconductor structure according to claim 1, wherein before the growing a first nitride layer on a surface, comprising an active silicon layer, of a substrate, the method further comprises:

performing an ion implantation on the active silicon layer to form a heavily doped region and a lightly doped region alternated with each other.

3. The method for preparing a semiconductor structure according to claim 2, wherein a dopant ion used in a step of the performing an ion implanting on the active silicon layer is a N-type dopant ion or a P-type dopant ion.

4. The method for preparing a semiconductor structure according to claim 2, wherein an area of the heavily doped region is larger than an area of the lightly doped region.

5. The method for preparing a semiconductor structure according to claim 1, wherein the partial area comprises a heavily doped region, and the selectively removing a partial area of the active silicon layer to form a hollow structure comprises:

selectively removing the heavily doped region of the active silicon layer by an electrochemical etching to form the hollow structure.

6. The method for preparing a semiconductor structure according to claim 5, wherein a hole ratio of the hollow structure is controlled by controlling a bias voltage of the electrochemical etching.

7. The method for preparing a semiconductor structure according to claim 1, wherein the first nitride layer and the second nitride layer form a nitride layer, the nitride layer is made of aluminum nitride, and a thickness of the nitride layer is less than 300 nm.

8. The method for preparing a semiconductor structure according to claim 1, wherein the substrate is a silicon-on-insulator substrate, and the silicon-on-insulator substrate comprises a support layer, a bonding layer, and the active silicon layer arranged in layers.

9. The method for preparing a semiconductor structure according to claim 8, wherein a crystal plane of the active silicon layer is Si (111).

10. The method for preparing a semiconductor structure according to claim 1, wherein the substrate is a QST engineered substrate, and the QST engineered substrate comprises a polycrystalline ceramic core, a barrier layer, a bonding layer, and the active silicon layer arranged in layers, the active silicon layer is used as a sacrificial layer.

11. The method for preparing a semiconductor structure according to claim 10, wherein a material of the active silicon layer is single crystal silicon.

12. The method for preparing a semiconductor structure according to claim 1, wherein a shape of a horizontal cross-section of the hollow structure is at least one of triangle, circle, ellipse, polygon, strip and mesh, the horizontal cross-section of the hollow structure is parallel to the substrate.

* * * * *